United States Patent
Bae et al.

(10) Patent No.: US 8,124,538 B2
(45) Date of Patent: Feb. 28, 2012

(54) SELECTIVE ETCH OF HIGH-K DIELECTRIC MATERIAL

(75) Inventors: In Deog Bae, Kyeonnggi (KR); Qian Fu, Fremont, CA (US); Wonchul Lee, Fremont, CA (US); Shenjian Liu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 432 days.

(21) Appl. No.: 12/422,108

(22) Filed: Apr. 10, 2009

(65) Prior Publication Data

US 2009/0258502 A1   Oct. 15, 2009

Related U.S. Application Data

(60) Provisional application No. 61/044,011, filed on Apr. 10, 2008.

(51) Int. Cl.
*H01L 21/302* (2006.01)
(52) U.S. Cl. ........................ 438/710; 438/719
(58) Field of Classification Search ........................ None
See application file for complete search history.

(56) References Cited

U.S. PATENT DOCUMENTS

| | | | |
|---|---|---|---|
| 2004/0014327 A1* | 1/2004 | Ji et al. | 438/722 |
| 2005/0081781 A1 | 4/2005 | Lin et al. | |
| 2005/0108892 A1* | 5/2005 | Wu et al. | 34/444 |
| 2006/0054595 A1* | 3/2006 | Starzynski | 216/57 |
| 2006/0286747 A1* | 12/2006 | Mouli et al. | 438/257 |
| 2007/0014820 A1 | 1/2007 | Litmanovitz et al. | |
| 2007/0056925 A1* | 3/2007 | Liu et al. | 216/67 |
| 2008/0254291 A1* | 10/2008 | Dehon et al. | 428/389 |

OTHER PUBLICATIONS

Day et al, Low energy ion etching of aluminum oxide films and native aluminum oxide, Dec. 1992, J. Appl. Phys., p. 5467-5470.*

* cited by examiner

*Primary Examiner* — Binh X Tran
*Assistant Examiner* — David Cathey, Jr.
(74) *Attorney, Agent, or Firm* — Beyer Law Group LLP

(57) ABSTRACT

A method for selectively etching a high-k dielectric layer with respect to a polysilicon material is provided. The high-k dielectric layer is partially removed by Ar sputtering, and then the high-k dielectric layer is etched using an etching gas comprising $BCl_3$. The high-k dielectric layer and the polysilicon material may be formed on a substrate. In order to partially remove the high-k dielectric layer, a sputtering gas containing Ar is provided into an etch chamber in which the substrate is placed, a plasma is generated from the sputtering gas, and then the sputtering gas is stopped. In order to etch the high-k dielectric layer, the etching gas is provided into the etch chamber, a plasma is generated from the etching gas, and then the etching gas is stopped.

15 Claims, 8 Drawing Sheets

SELECTIVE ETCH OF HIGH-K DIELECTRIC MATERIAL

CROSS REFERENCE TO RELATED APPLICATIONS

This application claims priority under 35 U.S.C. §119(e) from U.S. Provisional Application No. 61/044,011, entitled "SELECTIVE ETCH OF HIGH-K DIELECTRIC MATERIAL," filed Apr. 10, 2008, which is incorporated by reference in its entirety for all purposes.

BACKGROUND OF THE INVENTION

The present invention relates to etching process during the production of semiconductor devices. More specifically, the invention relates to etching process for semiconductor devices with a layer of a high-k dielectric constant material.

Conventionally, an ONO (oxide nitride oxide) layer has been used in flash memory gate stack for memory storage. However, the dielectric constant of ONO is not enough to meet the ever increasing demand in operation voltage. Accordingly, high dielectric constant material (also referred as to high-k dielectric material) has been introduced to replace ONO.

The dielectric constant of $SiO_2$ is about 3.9. If high k material like $Al_2O_3$ (aluminum oxide) is used to replace $SiO_2$, the dielectric constant will increase to around 9.0. Other than $Al_2O_3$, $HfO_2$, and $Ta_2O_3$ are also considered as candidates for high-k materials in flash memory gate stack to replace ONO. Among them, $Al_2O_3$, $HfO_2$ and $Al_2O_3/HfO_2/Al_2O_3$ sandwich structure have been used.

However, etching of high-k dielectric material has been found to be more difficult compared to etching ONO, because of lower volatility of its etch byproduct. Because of this, the etch rate and the selectivity to polysilicon film of high-k dielectric material have been found to be much lower compared to ONO film. Efforts have been made to increase the etch rate and selectivity of high k material to polysilicon. In order to achieve good etch selectivity to polysilicon, conventional $BCl_3$ based etch chemistry requires low bias voltage. However, such low-biased $BCl_3$ process has severe micro loading problems.

SUMMARY OF THE INVENTION

To achieve the foregoing and in accordance with the purpose of the present invention, a method for selectively etching a high-k dielectric layer with respect to a polysilicon material is provided. The high-k dielectric layer is partially removed by Ar sputtering, and then the high-k dielectric layer is etched using an etching gas comprising $BCl_3$. The high-k dielectric layer and the polysilicon material may be formed on a substrate. In order to partially remove the high-k dielectric layer, a sputtering gas containing Ar is provided into an etch chamber in which the substrate is placed, a plasma is generated from the sputtering gas, and then the sputtering gas is stopped. In order to etch the high-k dielectric layer, the etching gas is provided into the etch chamber, a plasma is generated from the etching gas, and then the etching gas is stopped.

In another manifestation of the invention, a method for selectively etching a high-k dielectric layer in a stack of layers with respect to a polysilicon material is provided. The stack includes a patterned first polysilicon layer formed on a substrate, the high-k dielectric layer formed over the first polysilicon layer, and a second polysilicon layer formed over the high-k dielectric layer. The second polysilicon layer is etched through a mask with mask features having a dense area and an isolated area. The high-k dielectric layer is selectively etched through the mask, with respect to the patterned polysilicon layer. The selective etch of the high-k dielectric layer includes (a) partially removing the high-k dielectric layer by Ar sputtering, and (b) further etching the high-k dielectric layer using an etching gas comprising $BCl_3$. The combination of the partial removal by Ar sputtering and the further etching using the etch gas reduces micro loading with respect to the dense area and the isolated area.

In another manifestation of the invention, an apparatus for selectively etching a high-k dielectric layer with respect to a polysilicon material is provided. The apparatus comprises a plasma processing chamber. The plasma processing chamber includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. The plasma processing chamber further includes a gas source in fluid connection with the gas inlet. The gas source includes a sputtering gas source, and a high-k dielectric etching gas source. A controller is controllably connected to the gas source and the at least one electrode. The controller includes at least one processor, and computer readable media having computer readable code for selectively etching the high-k dielectric layer with respect to the polysilicon material. The computer readable code includes computer readable code for providing an Ar sputtering gas from the sputtering gas source, computer readable code for generating a plasma from the sputtering gas to partially remove the high-k dielectric layer, computer readable code for stopping the sputtering gas, computer readable code for providing an etching gas from the high-k dielectric etching gas source, computer readable code for generating a plasma from the etching gas to etch the high-k dielectric layer, and computer readable code for stopping the etching gas.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
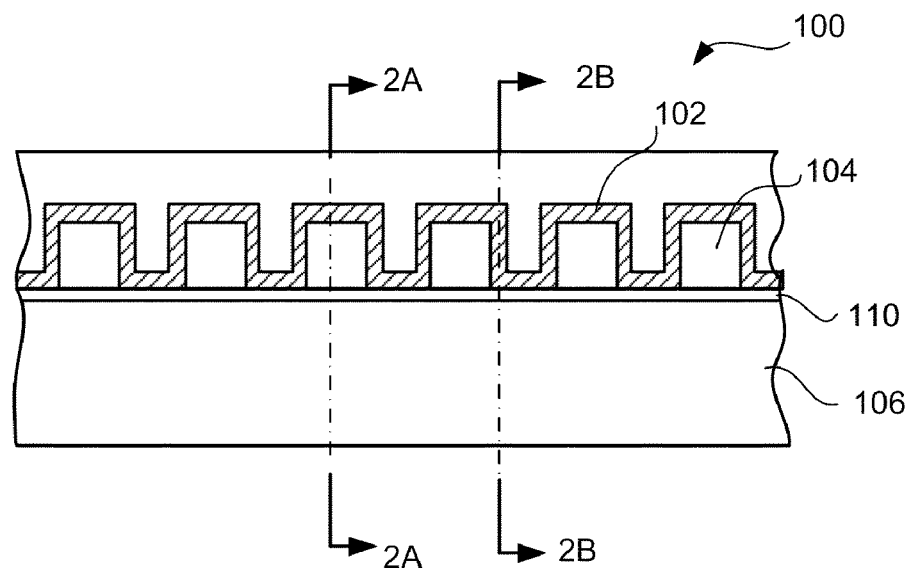
FIG. 1 is a schematic view of an example of a stack of layers including a high-k dielectric layer and a polysilicon layer formed on a substrate to be etched in accordance with one embodiment of the present invention.

To facilitate understanding, FIG. 1 schematically illustrates an example of a stack 100 of layers including a high-k dielectric layer 102 and a polysilicon layer 104 formed on a substrate 106 that may be etched in accordance with one embodiment of the present invention which selectively etches the high-k dielectric layer with respect to a polysilicon material. The substrate 106 may be of a silicon based material. Preferably, the silicon based material is substantially crystalline silicon, which may be part of a silicon wafer. As shown in FIG. 1, an oxide layer 110, such as a gate oxide, may be formed on the substrate 106 below the high-k dielectric layer 102 and the polysilicon layer 104. In this example, the polysilicon layer 104 is a patterned polysilicon layer having features such as ridges or trenches.

The high-k dielectric layer 102 is formed over the patterned polysilicon layer 104 so as to cover the top and sidewalls of the polysilicon layer 104 and also cover the bottom of the features (i.e., on the oxide layer 110), as shown in FIG. 1. Atomic layer deposition, sputtering or chemical vapor deposition may be used to deposit the layer of high-k dielectric material. In the specification and claims, a high-k dielectric material has a dielectric constant of at least 8 ($K \geq 8$). The high-k dielectric layer may be made of a metal oxide such as $Al_2O_3$ (aluminum oxide), $HfO_2$, or $Ta_2O_3$. The high-k dielectric layer 102 may be made of an oxide layer having $Al_2O_3/HfO_2/Al_2O_3$ sandwich structure. In addition, in an embodiment of the invention, the high-k dielectric layer may be formed from a material with a dielectric constant of at least 8, such as Hf silicate ($K \cong 11$), $HfO_2$ ($K \cong 25-30$), Zr silicate ($K \cong 11-13$), $ZrO_2$ ($K \cong 22-28$), $Al_2O_3$ ($K \cong 8-12$)), $La_2O_3$ ($K \cong 25-30$), $SrTiO_3$ ($K \cong 200$), $SrZrO_3$ ($K \cong 25$), $TiO_2$ ($K \cong 80$), and $Y_2O_3$ ($K \cong 8-15$), which are oxides.

Figure 2A:
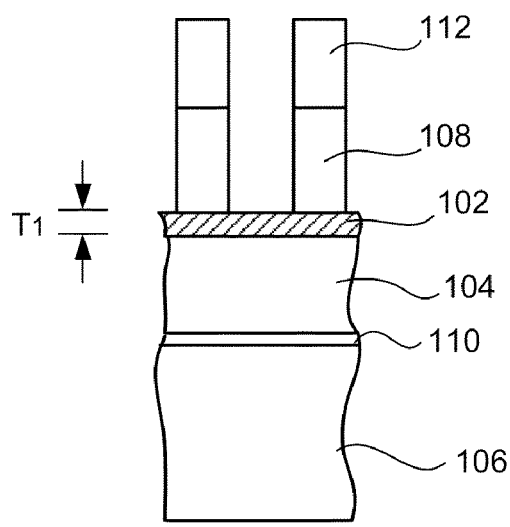
FIGS. 2A-2B are schematic cross-sectional views of the stack in FIG. 1 along cut lines 2A-2A and 2B-2B, respectively.
Figure 2B:
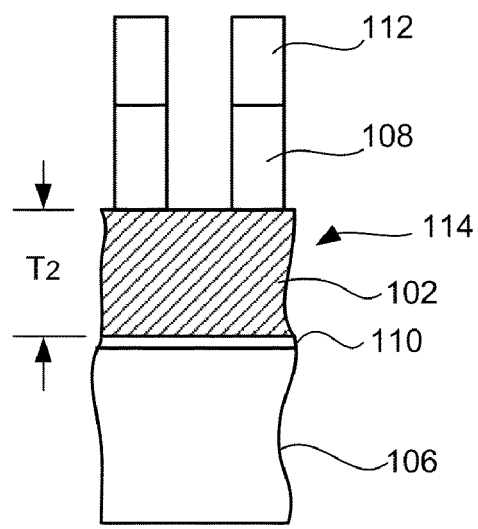

FIGS. 2A-2B are schematic cross-sectional views of the stack 100 of FIG. 1 along cut lines 2A-2A and 2B-2B, respectively. As shown in FIGS. 2A-2B, the stack 100 may also include a second polysilicon layer 108 formed over the high-k dielectric layer 102. Such a second polysilicon layer 108 may have been selectively etched with respect to the high-k dielectric layer 102 through a mask prior to the selective etch of the high-k dielectric layer, such that the high-k dielectric layer 102 to be etched is exposed on the surface of the stack 100. As shown in FIGS. 2A and 2B, one or more other layers 112 over the second polysilicon layer 108, including a mask, may have been formed and patterned by previous patterning and etching processes.

As shown in FIGS. 2A-2B, the thickness of the high-k dielectric layer 102 along the etch direction significantly vary depending on the location, and thus the etching of the high-k dielectric layer 102 provides a challenge. For example, comparing the thickness $T_1$ of the high-k dielectric layer 102 as shown in FIG. 2A, to the thickness $T_2$ Of the column 114 of the high-k dielectric layer 102 as shown in FIG. 2B, the thickness $T_2$ may be more than several times greater than thickness $T_1$. In order to remove the unmasked portion of the high-k dielectric layer 102, the high-k dielectric column 114 should be etched all the way down to the oxide layer 110 (FIG. 2B). Incomplete etching of the high-k dielectric layer columns 114 may form stringers or fences, which are undesirable. If the etch selectivity of the high-k dielectric layer 102 to the polysilicon layer 104 is less than one, an improper etch to eliminate the stringers or fences may cause etching of the oxide layer 110 where the high-k dielectric layer 102 is thin. Puncture in the oxide layer 110 could cause damage to the device.

Figure 3:
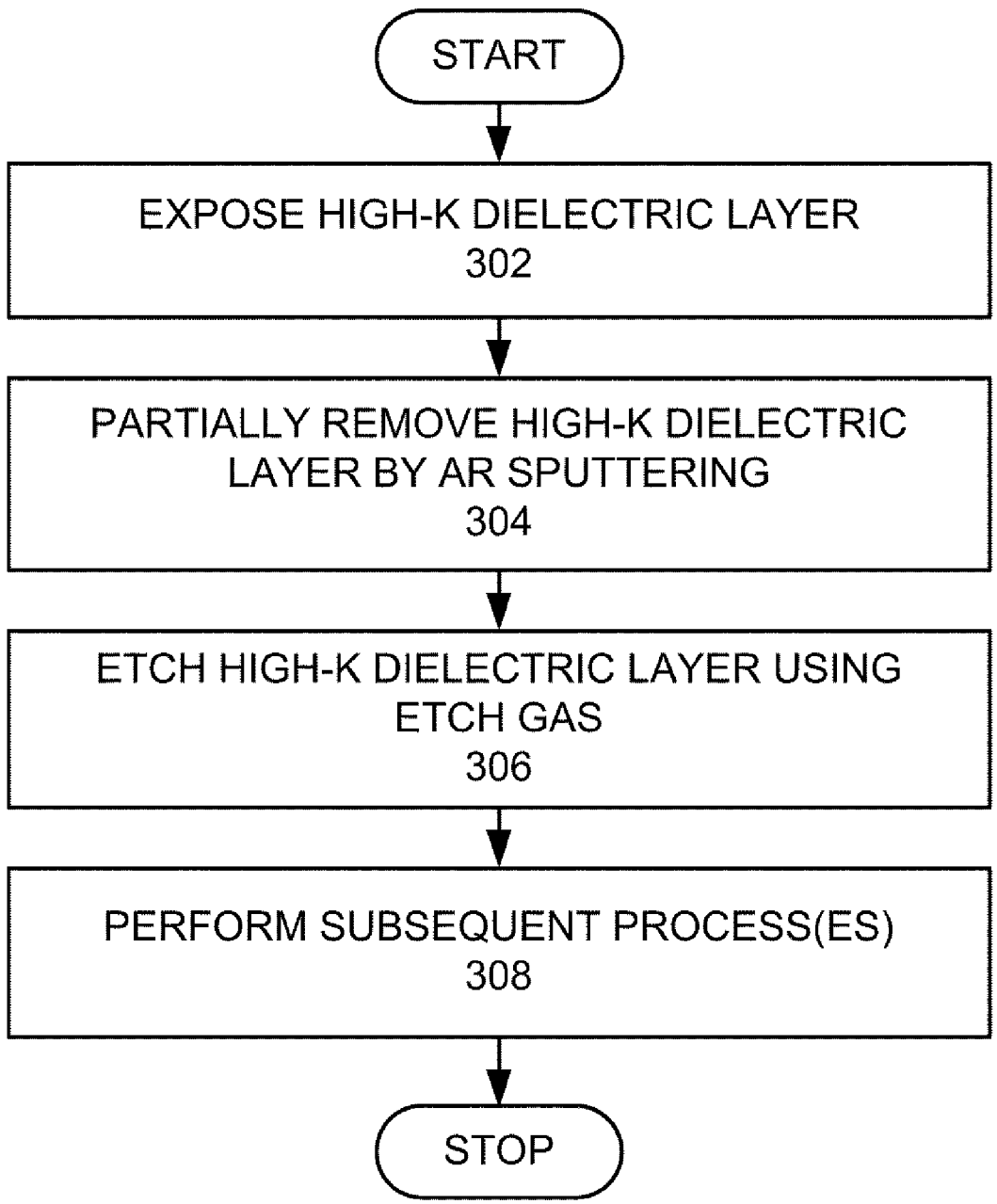
FIG. 3 is a high-level flow chart for selectively etching a high-k dielectric layer with respect to a polysilicon material in accordance with one embodiment of the present invention.

Embodiments of the present invention provides selective etch of the high-k dielectric layer 102 with respect to a polysilicon material. FIG. 3 is a high-level flow chart for selectively etching a high-k dielectric layer with respect to a polysilicon material in accordance with one embodiment of the present invention. The high-k dielectric layer to be etched may be exposed (step 302), for example, by etching one or more layers deposited over the high-k dielectric layer 102 through a patterned mask or masks using an etch chamber. For example, as shown in FIGS. 2A-2B, the stack 100 before the selective etch may have the patterned layer 112 including a patterned mask through which the high-k dielectric layer is selectively etched. In the selective etch step, first the high-k dielectric layer 102 is partially removed by a highly selective Ar sputtering (step 304). Then, the high-k dielectric layer 102 is etched using an etching gas comprising $BCl_3$ (step 306). Subsequent process(es) may be performed (step 308) in the same etch chamber. For example, the remaining polysilicon layer 104 may be etched away.

The Ar sputtering does not normally etch high-k dielectric material with good etch rate on a flat surface. However, it was found that Ar sputtering can remove exposed sidewall high-k material (high-k fence) with much greater etch rate. Very high selectivity of the sidewall high-k dielectric layer with respect to the polysilicon material is therefore achieved. This sputtering process also has very minimal or slightly reversed microloading. All these characteristics are very beneficial for high-k fence etch. However, because of the nature of sputtering, Ar sputtering step can only run for a limited time before undesirable sputtered by-product becomes excessive. It should also be noted that the present invention is not limited to a specific high-k dielectric layer/polysilicon layer configuration, but applicable to any situation where a high-k dielectric layer is to be selectively etched with respect to polysilicon material.

Figure 4:
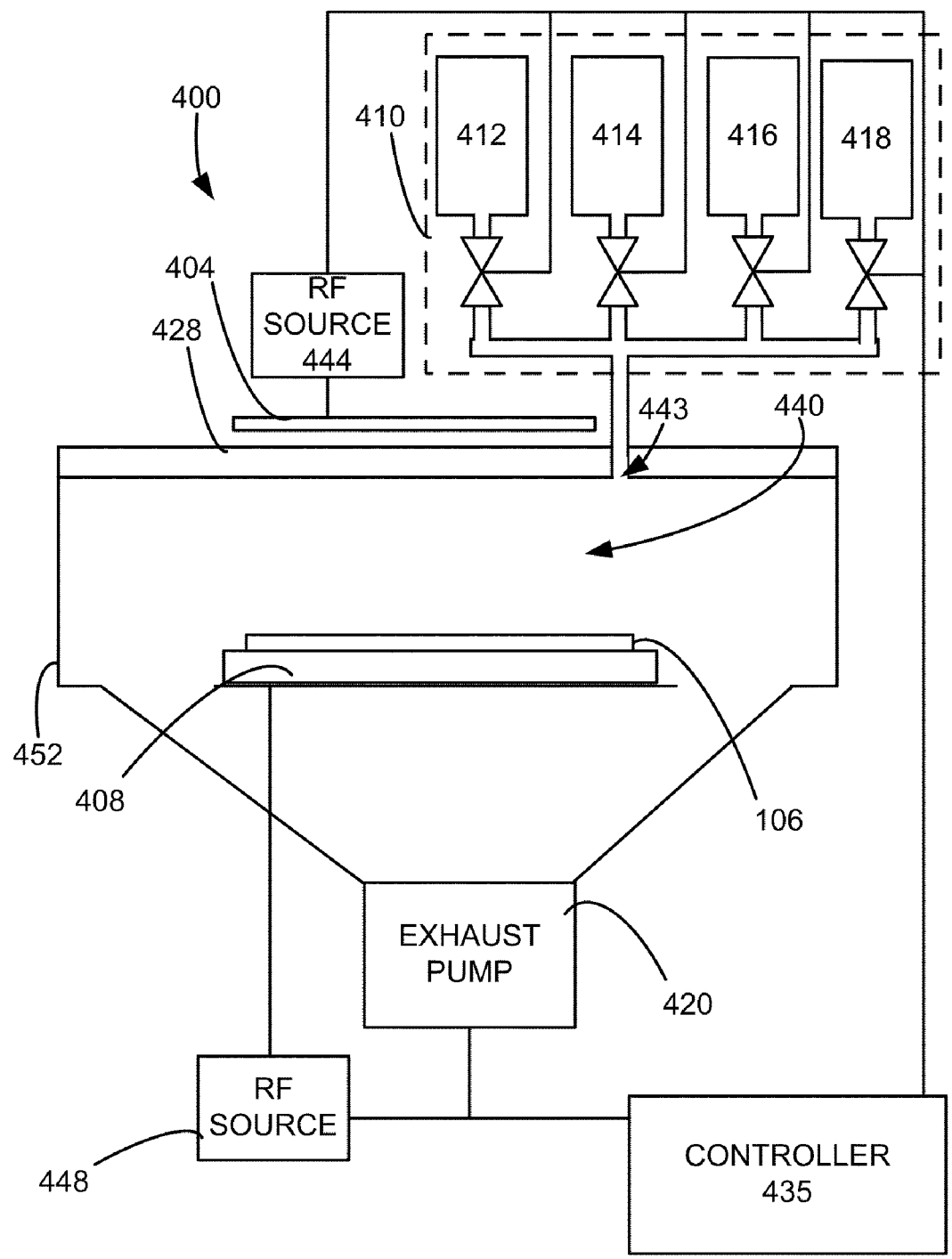
FIG. 4 is a schematic view of a process chamber that may be used in a preferred embodiment of the invention.

FIG. 4 is a schematic view of a process chamber 400 that may be used in the preferred embodiment of the invention. In this embodiment, the plasma processing chamber 400 comprises an inductive coil 404, a lower electrode 408, a gas source 410, and an exhaust pump 420. The gas source 410 may include an Ar sputtering gas source 412, a high-k dielectric etching gas source 414 such as a $BCl_3$ source. The gas source 410 may further include other gas sources 416 and 418 for other processes, such as etching processes for the layers over and/or under the high-k dielectric layer. Within plasma processing chamber 400, the substrate 106 is positioned upon the lower electrode 408. The lower electrode 408 incorporates a suitable substrate chucking mechanism (e.g., electrostatic, mechanical clamping, or the like) for supporting the substrate 106. The reactor top 428 incorporates a dielectric window. The reactor top 428, chamber walls 452, and lower electrode 408 define a confined plasma volume 440. Gas is supplied to the confined plasma volume by gas source 410 through a gas inlet 443 and is exhausted from the confined plasma volume by the exhaust pump 420. The exhaust pump 420 forms a gas outlet for the plasma processing chamber. A first RF source 444 is electrically connected to the coil 404. A second RF source 448 is electrically connected to the lower electrode 408. In this embodiment, the first and second RF sources 444, 448 comprise a 13.56 MHz power source. Different combinations of connecting RF power to the electrodes are possible. A controller 435 is controllably connected to the first RF source 444, the second RF source 448, the exhaust pump 420, and the gas source 410. The controller 435 is able to control the flow rate of the various gases. In this example the process chamber is a Versys® 2300, Versys® 2300 Star, Versys® 2300 Kiyo, available from Lam Research Corporation of Fremont Calif. Both the bottom and top RF sources provide a power signal at a frequency of 13.56 MHz.

Figure 5A:
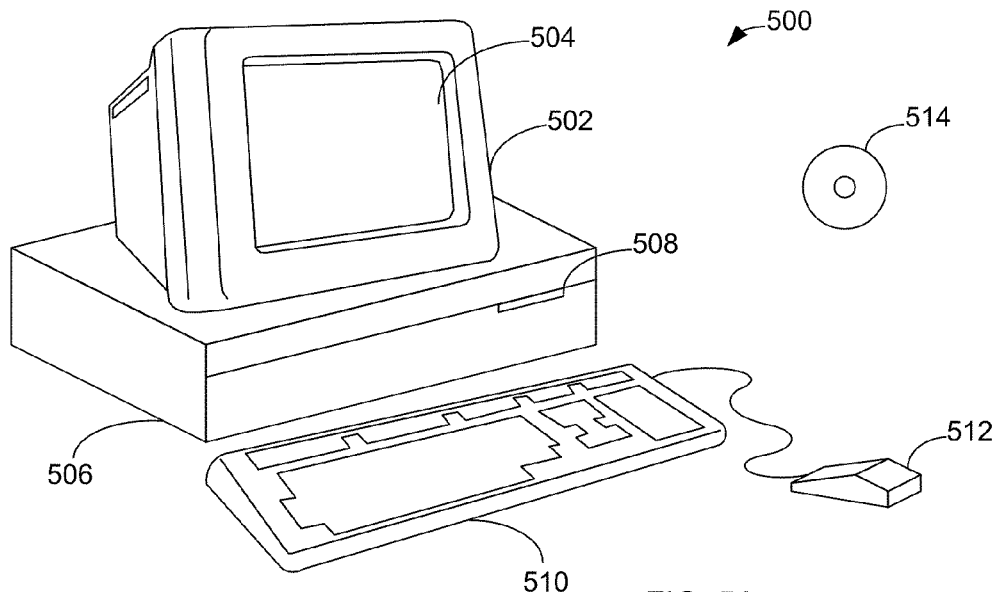
FIGS. 5A and 5B illustrate a computer system, which is suitable for implementing a controller.
Figure 5B:
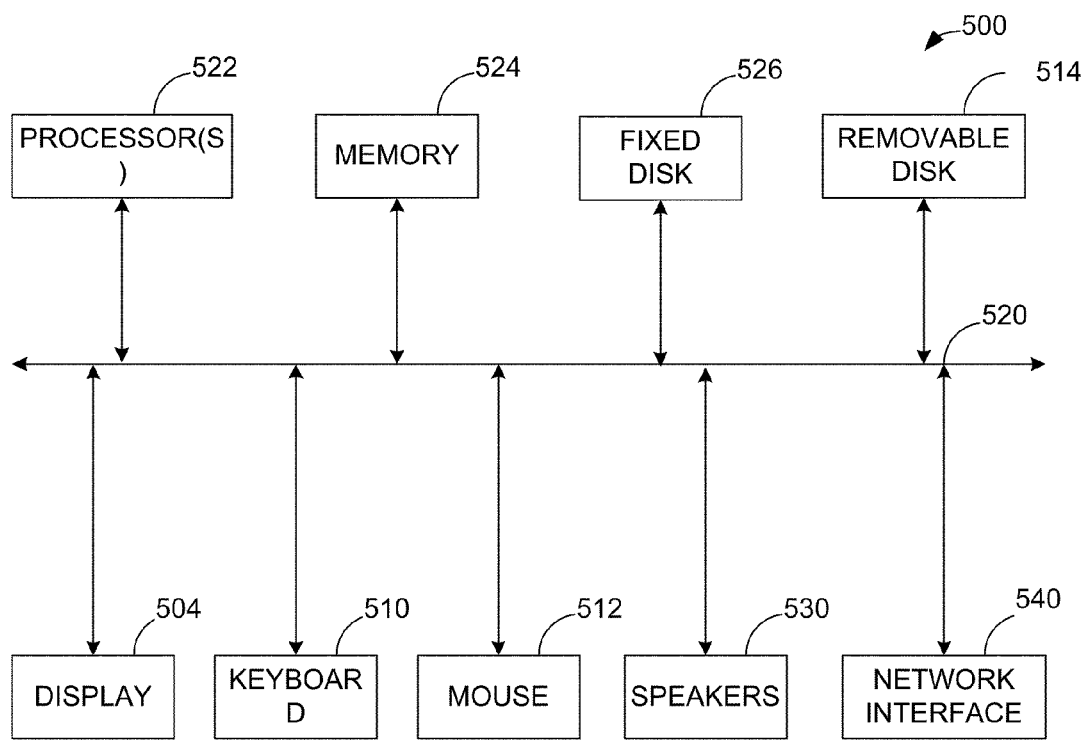

FIGS. 5A and 5B illustrate a computer system 500, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 is a wide variety of subsystems. Processor(s) 522 (also referred to as central processing units or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of any of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 6:
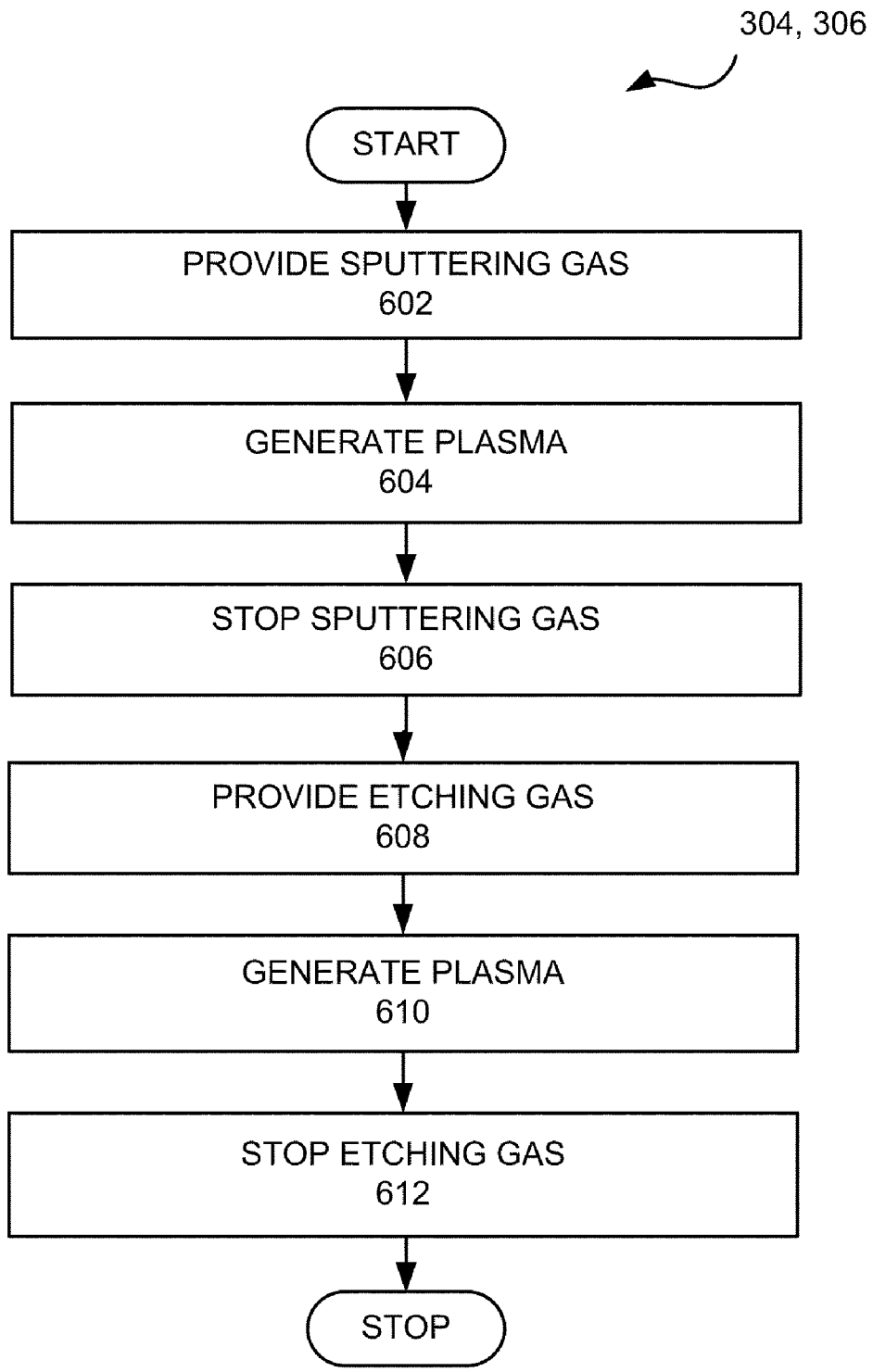
FIG. 6 is a detailed flow chart for the two-part selective etch process in accordance with one embodiment of the present invention.

FIG. 6 is a more detailed flow chart for the two-part selective etch process in accordance with one embodiment of the present invention. A sputtering gas is provided into an etch chamber in which the substrate 106 is placed (step 602). The sputtering gas includes Ar. In accordance with one embodiment of the present invention, the sputtering gas may include other gasses, such as Xe, Ne. Preferably, the sputtering gas is free of chemical etch gases such as Cl, HBr, or F. More preferably, pure Ar gas is used as the sputtering A plasma is generated from the sputtering gas to partially remove the high-k dielectric layer (step 604), and the sputtering gas is stopped (step 606). High selectivity of high-k fence to polysilicon is achieved in this step due to vast increased high-k fence etch rate. In an example, about 200 sccm Ar is provided in to the chamber with about 40 mT. The power of about 600 Watts and the bias voltage of about 150 volts are provided. The Ar sputtering is conducted under temperature about 60° C. for about 30 seconds.

Because of the nature of sputtering, Ar sputtering step can only run for a limited time before undesirable sputtered by-product becomes excessive. Therefore, a conventional $BCl_3$ based high-k etch step is followed to etch off the remaining high-k fence. In this step, an etching gas is provided into the etch chamber (step 608). The etching gas includes $BCl_3$. The etching gas may also include Ar. The high-k dielectric etching gas chemistry may be a mixture of $BCl_3$, $Cl_2$, and Ar. Other gasses, such as HBr may be added to the etching gas. Preferably, the etching as includes at least 40% of $BCl_3$. More generally, the etching as includes $BCl_3$ about 20 to 100% of the total gas flow. A plasma is generated from the etching gas (step 610) so as to etch the high-k dielectric. The etching gas is stopped (step 612). In an example, the high-k dielectric etching gas includes about 160 sccm $BCl_3$ and about 240 sccm Ar. The etching gas is introduced into the chamber at the pressure about 5 mT. 600 Watts power and 400 volts bias are provided. The process is conducted under temperature about 120° C. for better selectivity and less microloading.

Figure 7A:
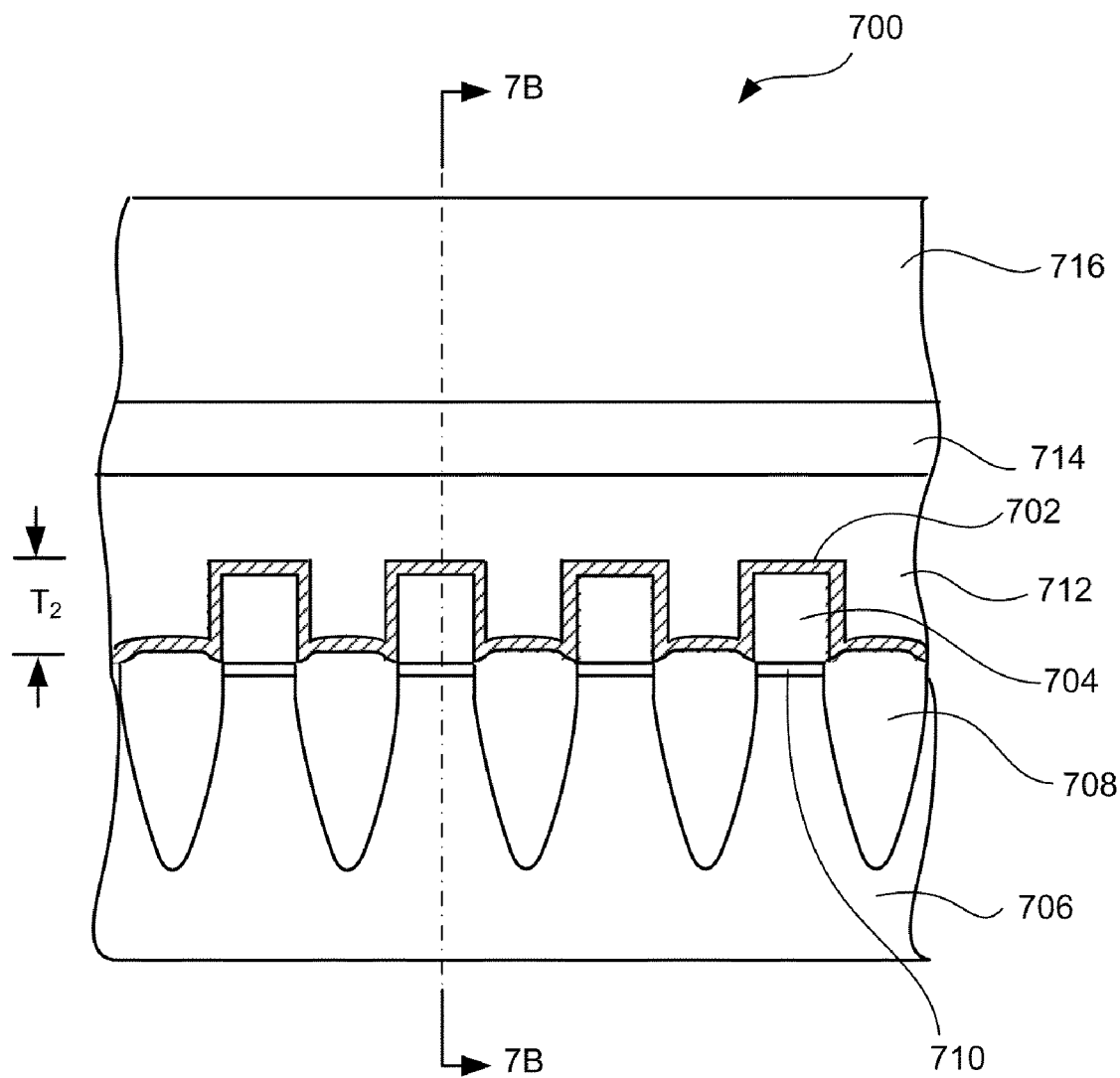
FIG. 7A is a schematic cross-sectional view of another example of a stack of layers including a high-k dielectric layer and a polysilicon layer formed on a substrate to be etched in accordance with one embodiment of the present invention.

FIG. 7A is a schematic cross-sectional view of another example of a stack 700 of layers including a high-k dielectric layer 702 and a patterned polysilicon layer 704 formed on a substrate 706 that may be etched in accordance with one embodiment of the present invention. The stack 700 may be a typical structure for a NAND flash memory device. The substrate 706 may be of a silicon based material. Preferably, the silicon based material is substantially crystalline silicon, which may be part of a silicon wafer. As shown in FIG. 7A, shallow trench isolation regions 708 are formed in the substrate 706. A gate oxide layer 710 is formed on the surface of the substrate 706. The gate oxide layer 710 may be formed by exposing the substrate 706 to oxygen. The polysilicon layer 704 is provided in the form of floating gates ("F-poly"). The polysilicon layer 704 may be formed by depositing a first polysilicon layer over the shallow trench isolation regions 708 and gate oxide 710, and then patterned into floating gate features using a first mask (not shown). The patterned polysilicon layer 704 may have a thickness of about 95 nm.

The high-k dielectric layer 702 is formed over the patterned first polysilicon layer 704 so as to cover the top and sidewalls of the floating gates, and also cover the bottom of the features. Atomic layer deposition, sputtering or chemical vapor deposition may be used to deposit the layer of high dielectric constant material. The high-k dielectric layer 702 may have a thickness of about 18 nm. A second polysilicon layer 712 is formed over the high-k dielectric layer 702. The second polysilicon layer 712 may have a thickness of about 90 nm from the high-k dielectric layer 702 at the top of the floating gates 704, and about 110 nm from the high-k dielectric layer 702 at the bottom of the features. The second polysilicon layer 712 will be patterned into control gates and thus may be referred to a as "C-poly". Since the high-k dielectric layer 702 is provided between the two polysilicon layers 704 and 712, it may be referred to as an interpoly dielectric layer (IPD). The high-k dielectric layer 702 may be made of a metal oxide such as $Al_2O_3$ (aluminum oxide), $HfO_2$, $Ta_2O_3$, or other high-k oxide as discussed above. Preferably, the high-k dielectric layer 702 is made of an oxide layer having $Al_2O_3/HfO_2/Al_2O_3$ sandwich structure.

As shown in FIG. 7A, the stack 700 may also include a tungsten based contact layer 714 such as WSix formed over the second polysilicon layer 712. The contact layer 714 may have a thickness of about 70 nm. The second polysilicon layer 712 may be planarized before depositing the contact layer 714. In addition, an oxide layer 716 may be formed over the contact layer 714 which may be photolithographically patterned into a hardmask. The oxide layer 716 may have a thickness of about 220 nm.

Figure 7B:
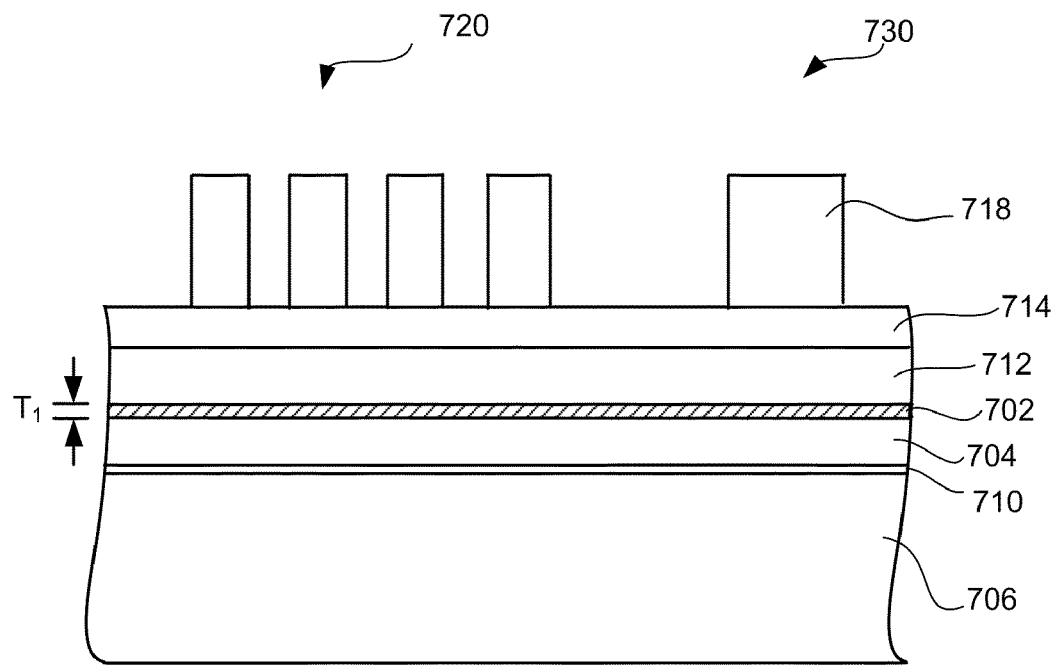
FIG. 7B is a schematic cross-sectional view of the stack of FIG. 7A along cut lines 7B-7B.
Figure 7C:
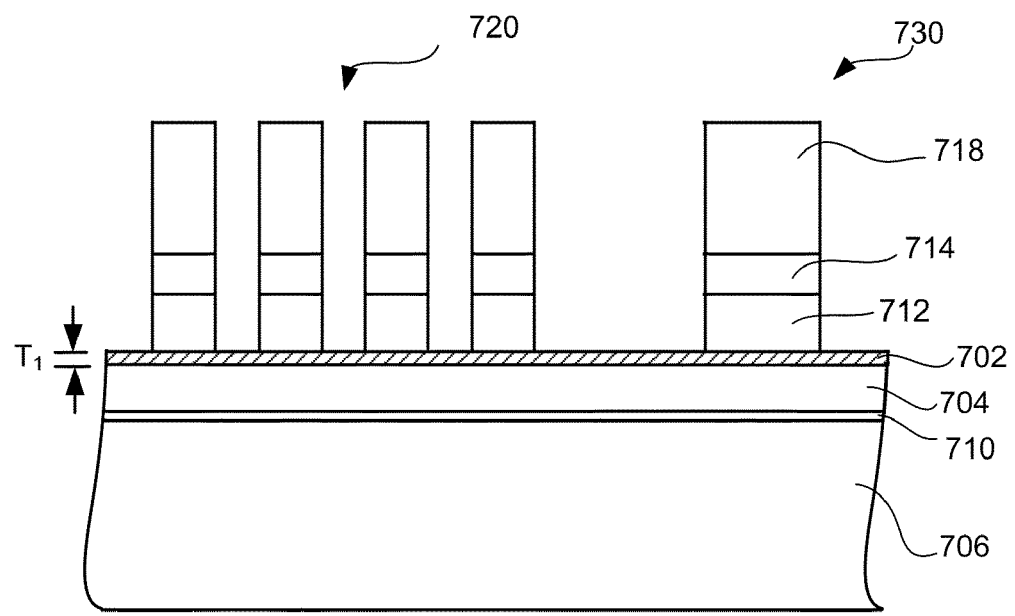
FIGS. 7C-7D are schematic cross-sectional views of the stack in the selective etch process in accordance with one embodiment of the present invention.

FIG. 7B is a schematic cross-sectional view of the stack 700 of FIG. 7A along cut lines 7B-7B. In FIG. 7B, the oxide layer 716 is illustrated as a patterned hardmask 718 provided on the contact layer 714. The hardmask 718 may be used for forming NAND flash memory cells. The tungsten based contact layer 714 and the second polysilicon layer 712 are etched first through the patterned hardmask 718. FIG. 7C schematically illustrates a cross-sectional view of the stack 700 in which the high-k dielectric layer 702 to be etched is exposed after the contact layer 714 and the second polysilicon layer 712 are etched. As shown in the figures, memory cells (i.e., gate structures) are densely packed in a dense area 720, while no memory cells are formed in an isolated (iso) area 730. The isolated 730 area may have a select gate structure.

The interpoly high-k dielectric layer 702 is selectively etched by a two-part process including the first part of Ar sputtering and the second part of high-k dielectric etch using a $BCl_3$ based etching gas, as discussed above. The thickness of the high-k dielectric layer 702 varies significantly depending on the location. In this example, the etching of the high-k dielectric layer (IPD layer) 702 involves etching of the thin high-k dielectric layer of about 18 nm ($T_1$) on top of the first polysilicon layer 704 and etching through the column of the high-k dielectric as thick as about 110 nm ($T_2$) at the side wall or step of the first polysilicon layer 704 which is more than 6 times grater than $T_1$. Thus, if the etch selectivity of the high-k dielectric layer to the polysilicon material is below one (1), the first polysilicon layer 704 will be removed first, and the gate oxide 710 will be exposed during the high-k dielectric etch process. Such exposure would likely result in puncture of the gate oxide, causing device effects. Accordingly, a high selectivity of high-k dielectric to polysilicon material is necessary for the IPD etch to have a good process window. In order to achieve good selectivity, typical $BCl_3$ based etch chemistry can be used only with low bias voltage. However, such a low-bias $BCl_3$ etch process is accompanied by significant micro loading effects, where high-k dielectric etch would shut down incomplete in the dense area 720.

Figure 7D:
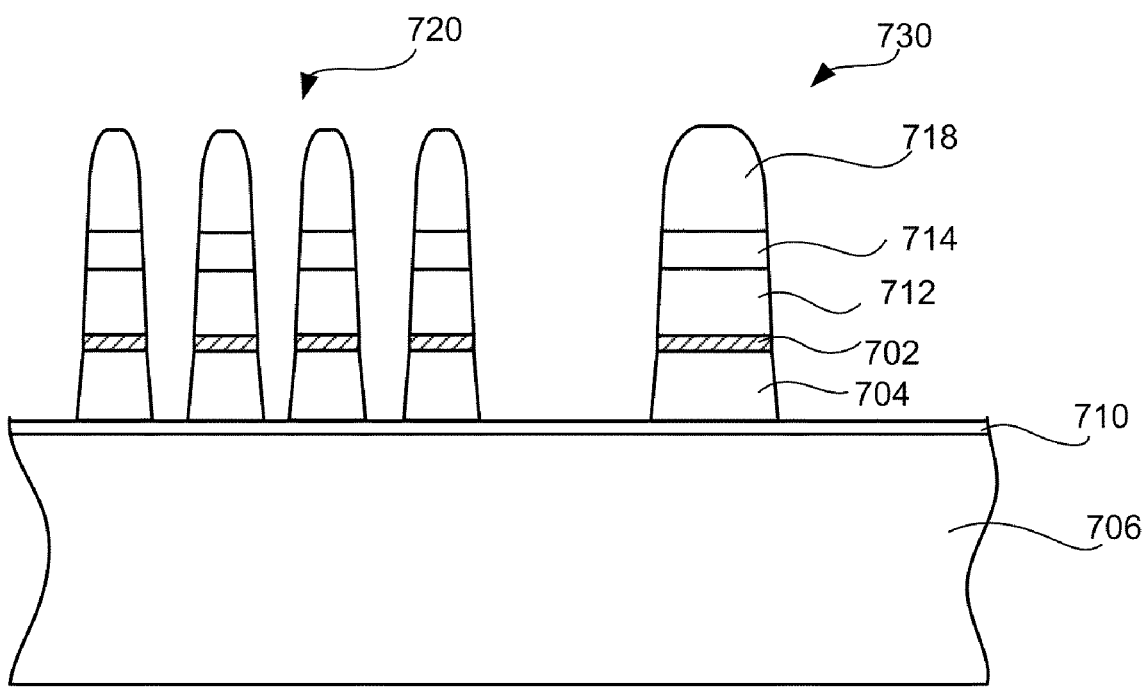

In accordance with the present invention, the two-part high-k dielectric etch is provided in which Ar sputtering is performed prior to a conventional high-k dielectric etch process. The high-k dielectric layer is partially removed by the Ar sputtering, and then is further etched using an etching gas comprising $BCl_3$. The novel combination of the partial removal of the high-k dielectric layer by Ar sputtering and the further etching of the high-k dielectric layer using the etch gas not only improves the selectivity but also reduces micro loading with respect to the dense area and the isolated area. For example, a high selectivity of the high-k dielectric to polysilicon material of about 2 to 20, preferably about 5 to 20 was achieved in the Ar sputtering step. By conducting the Ar sputtering prior to the $BCl_3$ based high-k dielectric etching, the high-k dielectric etching did not shut down in the dense area 720 but etched through to the desired point. As a result, zero to slightly-reverse microloading was achieved. FIG. 7D is a schematic cross-sectional view of the stack 700 after the selective etch process in accordance with one embodiment of the present invention.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for selectively etching a high-k dielectric layer with respect to a polysilicon material, comprising:
   partially removing the high-k dielectric layer by Ar sputtering; and
   etching the high-k dielectric layer using an etching gas comprising $BCl_3$, wherein the method provides a high selectivity of the high-k dielectric to the polysilicon material of about 2 to 20,
   and wherein the etching as consists of $BCl_3$; consists of $BCl_3$ and Ar; consists of $BCl_3$, $Cl_2$ and Ar; consists of $BCl_3$ and HBr; consists of $BCl_3$ HBr, and Ar; or consists of $BCl_3$, $Cl_2$, HBr, and Ar.

2. The method as recited in claim 1, wherein the high-k dielectric layer and the polysilicon material are formed on a substrate, the partially removing comprising:

providing a sputtering gas into an etch chamber in which the substrate is placed, the sputtering gas comprising Ar;

generating a plasma from the sputtering gas to partially remove the high-k dielectric layer; and stopping the sputtering gas.

3. The method as recited in claim 2, wherein the etching the high-k dielectric layer comprises:

providing the etching gas into the etch chamber;

generating a plasma from the etching gas to etch the high-k dielectric layer; and stopping the etching gas.

4. The method as recited in claim 2, wherein the sputtering gas is free of chemical etch gases.

5. The method as recited in claim 2, wherein the sputtering gas is free of Cl, HBr, and F.

6. The method as recited claim 2, wherein the sputtering gas is pure Ar.

7. The method as recited in claim 1, wherein the partially removing the high-k dielectric layer by Ar sputtering provides a high selectivity of the high-k dielectric to the polysilicon material of about 5 to 20.

8. The method as recited in claim 1, wherein the high-k dielectric layer is a metal oxide layer.

9. The method as recited in claim 1, wherein the high-k dielectric layer is formed over a patterned polysilicon layer, a second polysilicon layer being formed over the high-k dielectric layer, the method further comprising:

exposing the high-k dielectric layer to be etched by etching the second polysilicon layer.

10. A method for selectively etching a high-k dielectric layer in a stack of layers with respect to a polysilicon material, the stack including a patterned first polysilicon layer formed on a substrate, the high-k dielectric layer formed over the first polysilicon layer, and a second polysilicon layer formed over the high-k dielectric layer, the method comprising:

etching the second polysilicon layer through a mask with mask features having a dense area and an isolated area; and selectively etching, through the mask, the high-k dielectric layer with respect to the patterned polysilicon layer, including:

partially removing the high-k dielectric layer by Ar sputtering; and further etching the high-k dielectric layer using an etching gas comprising $BCl_3$, wherein the method provides a high selectivity of the high-k dielectric to the polysilicon material of about 2 to 20, wherein combination of the partially removing by Ar sputtering and the further etching using the etch gas reduces micro loading with respect to the dense area and the isolated area, and wherein the etching as consists of $BCl_3$; consists of $BCl_3$ and Ar; consists of $BCl_3$, $Cl_2$ and Ar; consists of $BCl_3$ and HBr; consists of $BCl_3$, HBr, and Ar; or consists of $BCl_3$, $Cl_2$, HBr, and Ar.

11. The method as recited in claim 10, wherein the stack of layers further includes a contact layer formed on the second polysilicon layer, the mask being formed on the contact layer.

12. The method as recited in claim 10, wherein the first polysilicon layer is also removed through the mask features during the selectively etching of the high-k dielectric layer.

13. The method as recited in claim 12, wherein an oxide layer is formed on the substrate below the first polysilicon layer, the selectively etching of the high-k dielectric layer removing the first polysilicon layer through the mask features and leaving the oxide layer on the substrate.

14. The method as recited in claim 1, wherein the partially removing the high-k dielectric layer and the etching the high-k dielectric layer are performed in the same process chamber.

15. The method as recited in claim 10, wherein the partially removing the high-k dielectric layer comprises:

removing exposed sidewall high-k dielectric material in the dense area at a greater etch rate than that in the isolated area.

\* \* \* \* \*